(12) United States Patent
Hashimoto et al.

(10) Patent No.: US 9,589,660 B1
(45) Date of Patent: Mar. 7, 2017

(54) SEMICONDUCTOR PILLARS CHARGED IN READ OPERATION

(71) Applicant: KABUSHIKI KAISHA TOSHIBA, Tokyo (JP)

(72) Inventors: Toshifumi Hashimoto, Fujisawa Kanagawa (JP); Takeshi Nakano, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/174,580

(22) Filed: Jun. 6, 2016

(30) Foreign Application Priority Data

Sep. 14, 2015 (JP) ................................. 2015-180378

(51) Int. Cl.
| | |
|---|---|
| G11C 16/26 | (2006.01) |
| G11C 16/34 | (2006.01) |
| G11C 16/14 | (2006.01) |
| H01L 27/115 | (2006.01) |
| H01L 23/522 | (2006.01) |
| H01L 23/528 | (2006.01) |

(52) U.S. Cl.
CPC .......... *G11C 16/3459* (2013.01); *G11C 16/14* (2013.01); *G11C 16/26* (2013.01); *H01L 23/528* (2013.01); *H01L 23/5226* (2013.01); *H01L 27/1157* (2013.01); *H01L 27/11582* (2013.01)

(58) Field of Classification Search
CPC ..... G11C 16/0483; G11C 16/06; G11C 16/16; G11C 16/26; G11C 16/04; G11C 16/10; G11C 16/24; G11C 16/3409; G11C 16/3413; G11C 7/18; G11C 29/82
See application file for complete search history.

(56) References Cited

U.S. PATENT DOCUMENTS

| | | | |
|---|---|---|---|
| 7,408,811 B2 | 8/2008 | Shirota et al. | |
| 7,852,675 B2 | 12/2010 | Maejima | |
| 8,179,720 B2 | 5/2012 | Fukuda et al. | |
| 8,295,091 B2 | 10/2012 | Itagaki et al. | |
| 8,372,720 B2 | 2/2013 | Fukuzumi et al. | |
| 8,952,426 B2 | 2/2015 | Maejima | |
| 9,053,807 B2 | 6/2015 | Hashimoto | |

(Continued)

FOREIGN PATENT DOCUMENTS

| | | | |
|---|---|---|---|
| JP | 2006-309902 A | 11/2006 | |
| JP | 2007-193862 A | 8/2007 | |

(Continued)

*Primary Examiner* — Hien Nguyen
(74) *Attorney, Agent, or Firm* — Patterson & Sheridan, LLP

(57) ABSTRACT

A memory device includes a word line above a semiconductor substrate, a semiconductor pillar extending through the word line in a direction crossing a surface of the semiconductor substrate, a memory cell at an intersection of the word line and the semiconductor pillar and having a gate electrically connected to the word line, a bit line electrically connected to a first end of the memory cell, a source line electrically connected to a second end of the memory cell, and a controller that controls a write operation on the memory cell, the write operation including a program operation followed by a verify operation. During the verify operation on the memory cell, the semiconductor pillar is charged after performing a read operation on the memory cell.

20 Claims, 13 Drawing Sheets

(56) References Cited

U.S. PATENT DOCUMENTS

| | | |
|---|---|---|
| 2006/0245251 A1 | 11/2006 | Shirota et al. |
| 2007/0183208 A1 | 8/2007 | Tanaka et al. |
| 2009/0267128 A1 | 10/2009 | Maejima |
| 2009/0268522 A1 | 10/2009 | Maejima |
| 2010/0207195 A1 | 8/2010 | Fukuzumi et al. |
| 2010/0238733 A1 | 9/2010 | Fukuda et al. |
| 2011/0255336 A1* | 10/2011 | Futatsuyama ....... G11C 11/5628 365/185.03 |
| 2011/0284946 A1 | 11/2011 | Kiyotoshi |
| 2015/0325303 A1 | 11/2015 | Hashimoto et al. |
| 2016/0071593 A1 | 3/2016 | Hashimoto |

FOREIGN PATENT DOCUMENTS

| | | |
|---|---|---|
| JP | 2010-225225 A | 10/2010 |
| JP | 2016-017377 A | 2/2016 |
| JP | 2016-037803 A | 3/2016 |

\* cited by examiner

SEMICONDUCTOR PILLARS CHARGED IN READ OPERATION

CROSS-REFERENCE TO RELATED APPLICATION

This application is based upon and claims the benefit of priority from Japanese Patent Application No. 2015-180378, filed Sep. 14, 2015, the entire contents of which are incorporated herein by reference.

FIELD

Embodiments described herein relate generally to a memory device.

BACKGROUND

In the related art, a NAND flash memory in which memory cells are arranged in three dimensions is known.

DETAILED DESCRIPTION

Embodiments improve reliability of a memory device.

In general, according to one embodiment, a memory device includes a word line above a semiconductor substrate, a semiconductor pillar extending through the word line in a direction crossing a surface of the semiconductor substrate, a memory cell at an intersection of the word line and the semiconductor pillar and having a gate electrically connected to the word line, a bit line electrically connected to a first end of the memory cell, a source line electrically connected to a second end of the memory cell, and a controller that controls a write operation on the memory cell, the write operation including a program operation followed by a verify operation. During the verify operation on the memory cell, the semiconductor pillar is charged after performing a read operation on the memory cell.

Hereinafter, embodiments will be described in detail with reference to the drawings. In the following description, components having the same functions and configurations are denoted by the same reference signs.

In the following description of the embodiments, if reference signs with numbers/letters for differentiation at the end thereof (for example, word lines WL, bit lines BL, various voltages and signals, or the like) are not distinguished from each other, the reference signs are used without the number/letter at the end thereof.

EMBODIMENTS

A memory device according to embodiments will be described with reference to FIG. 1 to FIG. 14.

1. First Embodiment a. Configuration

A configuration example of a memory device according to an embodiment will be described with reference to FIG. 1 to FIG. 7.

Figure 1:
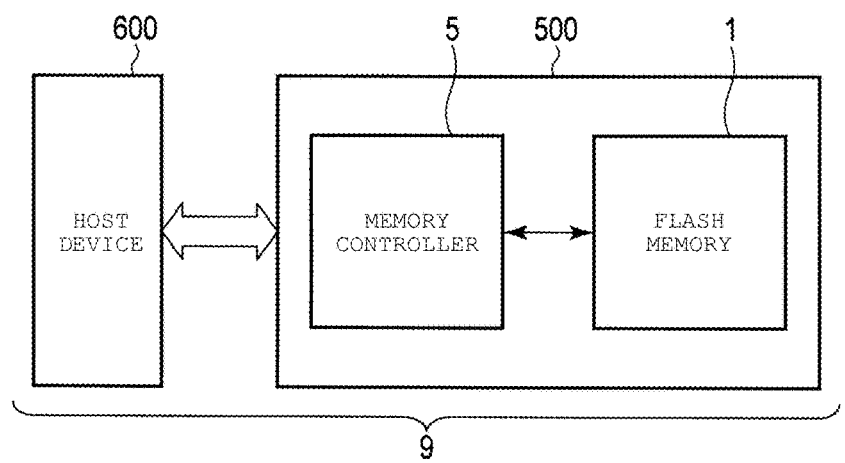
FIG. 1 is a block diagram illustrating a memory system including a memory device according to an embodiment.

As illustrated in FIG. 1, a memory system 9 including a memory device according to the embodiment includes a storage device 500 and a host device 600.

The host device 600 is coupled to the storage device 500 through, for example, connecters, cables, wireless communication, the Internet, or the like.

The host device 600 makes a data write/erase request and a data read request to the storage device 500.

The storage device 500 includes a memory controller 5, and a memory device (e.g., flash memory) 1.

The memory controller 5 causes the memory device 1 to execute an operation corresponding to the request from the host device 600.

The memory controller 5 includes, for example, a processor (CPU), a DRAM, an SRAM, an ECC circuit, and the like. The CPU controls the overall operation of the memory controller 5. The DRAM and the SRAM temporarily store programs (software/firmware) and management information (management table). The ECC circuit detects an error in data read from the memory device, and corrects the detected error.

The memory device 1 stores data. The memory device 1 executes data writing and data reading, based on the instruction from the controller 5 (which may be issued based on the request from the host device 600).

The memory device 1 is, for example, a NAND flash memory. For example, the storage device 500 (or the memory system 9) including the flash memory 1 is a memory card (for example, an SD™ card, or an eMMC™), a USB memory, a solid state drive (SSD), or the like.

Figure 2:
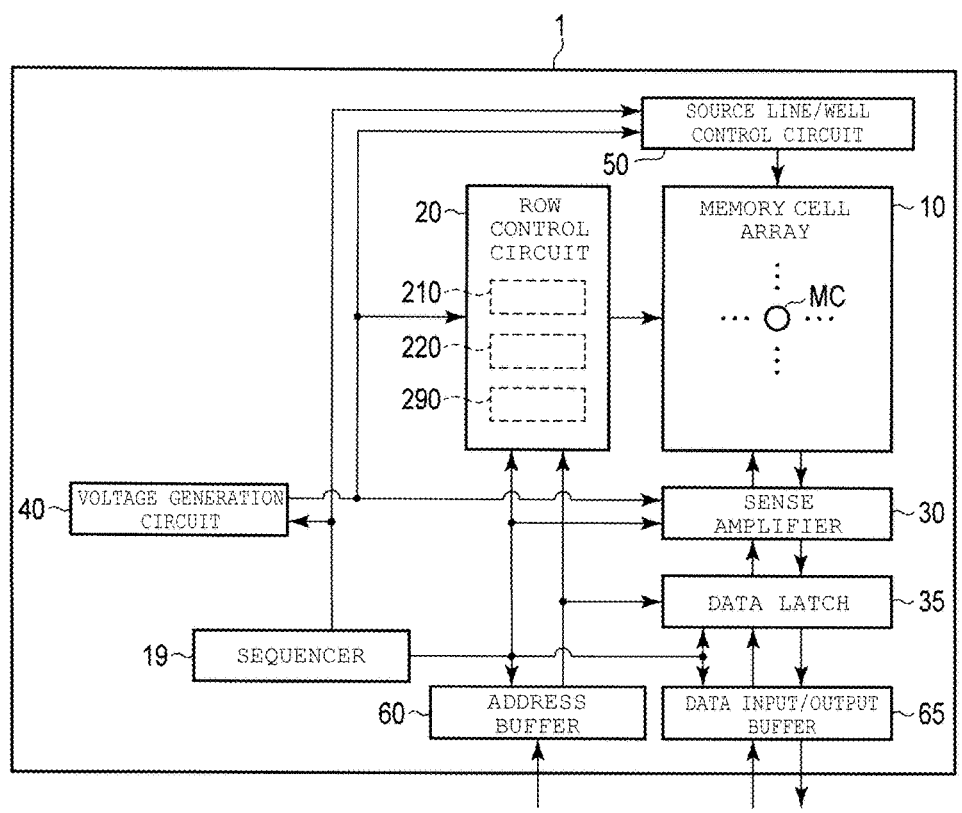
FIG. 2 is a block diagram illustrating an internal configuration of the memory device according to the embodiment.

As illustrated in FIG. 2, the NAND flash memory 1 includes a memory cell array 10, a row control circuit 20, a sense amplifier circuit 30, a data latch circuit 35, a voltage generation circuit 40, a source line/well control circuit 50, an address buffer 60, a data input/output buffer 65, a sequencer 19, and the like.

The memory cell array 10 includes a plurality of memory cells MC. One memory cell is capable of storing one or more bits of data.

The row control circuit 20 controls the row (for example, a word line) of the memory cell array 10.

The sense amplifier circuit 30 senses and amplifies a signal output to the bit line in the memory cell array 10 during data reading. For example, the sense amplifier circuit 30 senses generation of a current in the bit line or variation of the potential of the bit line, as a signal from the memory cell MC. Thus, the sense amplifier circuit 30 reads the data stored in the memory cell MC. Further, the sense amplifier circuit 30 controls the voltage of the bit line, in response to a signal corresponding to the write data, during data writing.

The data latch circuit (page buffer circuit) 35 temporarily stores data output from the memory cell array 10, and data to be input to the memory cell array 10.

The voltage generation circuit 40 generates various voltages used in the operation of the memory cell array 10.

The source line/well control circuit 50 controls the potential of a source line in the memory cell array 10. The source line/well control circuit 50 controls the potential of a well region in the memory cell array 10.

The address buffer 60 temporarily stores an address ADR from the memory controller 5. The address buffer 60 supplies the address ADR to the row control circuit 20 and the data latch circuit 35.

The data input/output buffer 65 temporarily stores data from the memory controller 5 and data from the data latch circuit 35.

The sequencer 19 controls the overall operation of the flash memory 1. The sequencer 19 controls the internal operation of the flash memory 1, based on the control signal and commands which are exchanged with the memory controller 5 and the flash memory 1.

Configuration of Memory Cell Array of Three-Dimensional Structure

With reference to FIG. 3 to FIG. 6, an example of an internal configuration of the memory cell array of the flash memory according to the embodiment will be described.

The flash memory 1 according to the embodiment includes the memory cell array 10 of a three-dimensional structure.

Figure 3:
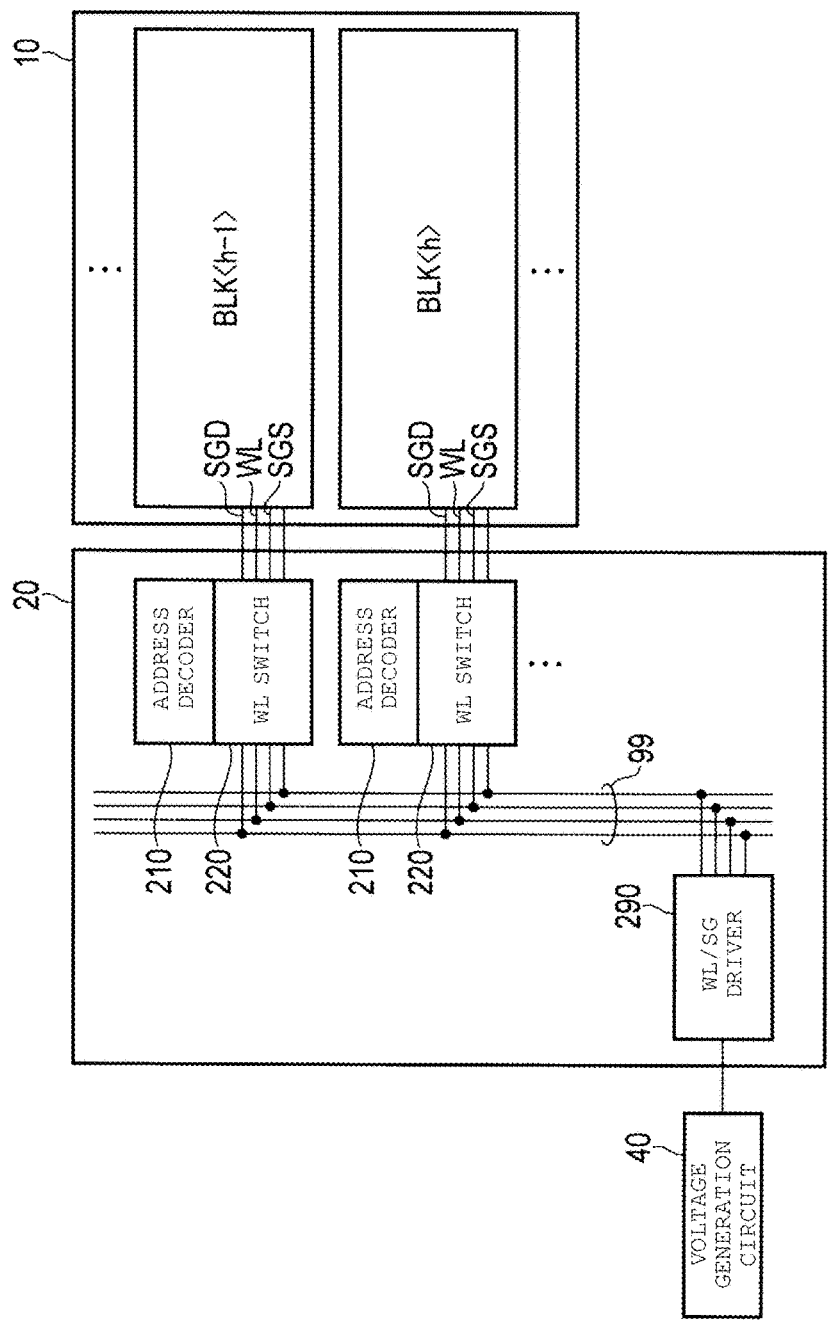
FIG. 3 is another block diagram illustrating the internal configuration of the memory device according to the embodiment.

As illustrated in FIG. 3, the memory cell array 10 includes one or more blocks BLK (BLK<h>, BLK<h-1>, where h is an integer of 0 or more). The block BLK represents an erase unit. However, the erase operation of the memory cell array 10 may be executed in units smaller than the block. With respect to the erase operation of the flash memory, the configurations described in U.S. patent application Ser. No. 12/679,991, filed on Mar. 25, 2010, entitled "Non-volatile semiconductor storage device and method of manufacturing the same," and U.S. patent application Ser. No. 12/532,030, filed on Mar. 23, 2009, entitled "Semiconductor memory and manufacturing method thereof" may be incorporated in the embodiment. Accordingly, the entire contents of these patent applications are incorporated by reference herein.

The row control circuit 20 includes a plurality of address decoders 210, a plurality of switch circuits 220, and a word line/select gate line driver 290.

The address decoders 210 decode the address ADR from the memory controller 5. The address decoders 210 supply the decoding result to the switch circuits 220.

The switch circuits 220 correspond to the address decoders 210 in one-to-one manner. The switch circuits 220 correspond to the blocks BLK in one-to-one manner. The plurality of switch circuits 220 are connected to a common wiring group 99.

The switch circuit 220 selects a block BLK indicated by the address ADR, based on the decoding result. The switch circuit 220 controls the selection and non-selection of the word line WL and the select gate lines SGD and SGS in the selected block BLK.

The switch circuit 220 connects the word line WL and the select gate lines SGD and SGS in the selected block BLK to a control line corresponding to wiring in the selected block, among a plurality of control lines included in the wiring group 99.

The word line/select gate line driver 290 is connected to the wiring group 99 which includes the plurality of control lines. The word line/select gate line driver 290 transfers the voltages to be applied to the word line WL and the select gate lines SGD and SGS, from the voltage generation circuit 40 to the wiring group 99. Thus, various voltages are applied to the word line WL and the select gate lines SGD and SGS in the selected block BLK, through the selected switch circuit 220.

Figure 4:
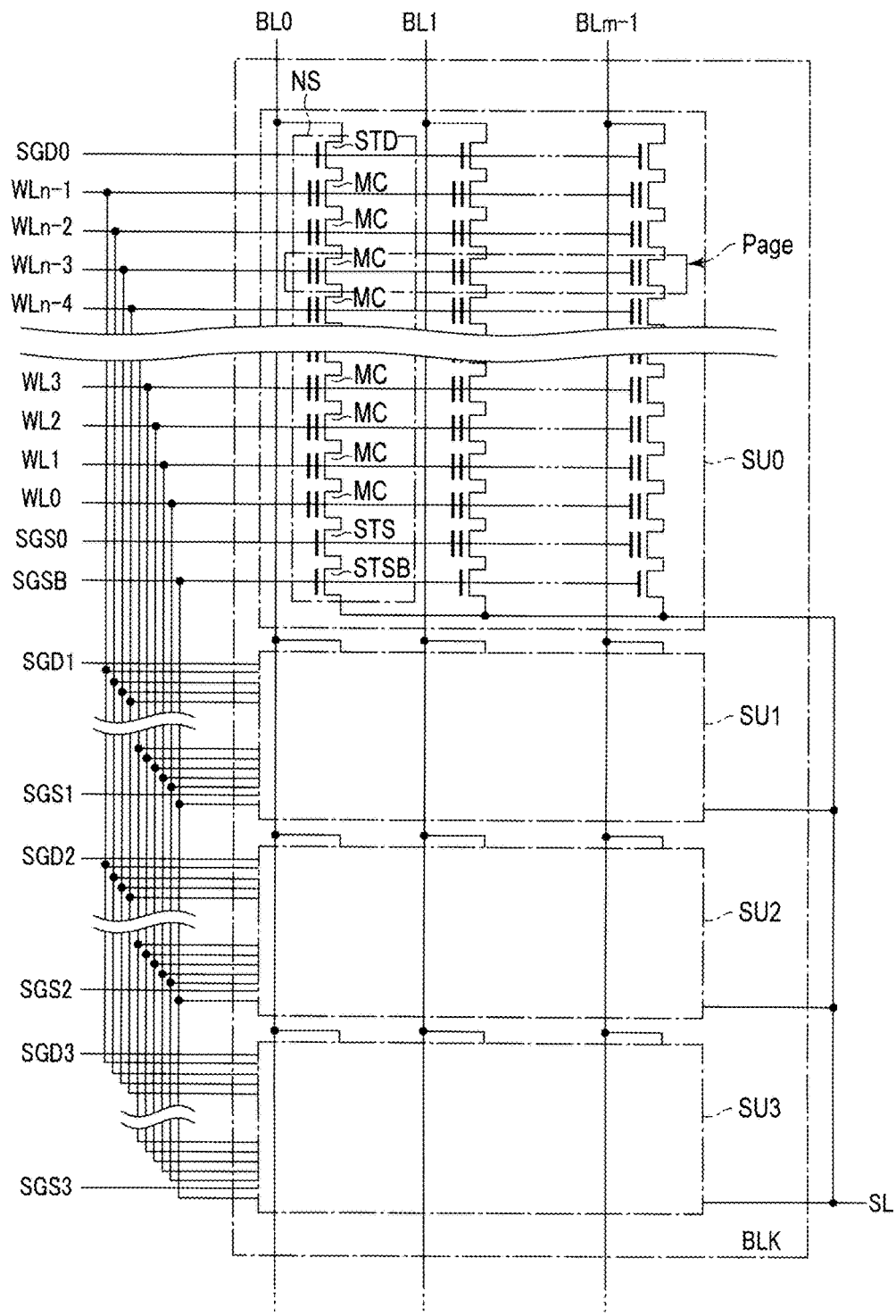
FIG. 4 is a circuit diagram of a memory cell array of the memory device according to the embodiment.

As in the example illustrated in FIG. 4, in a memory cell array of a three-dimensional structure, one block BLK includes a plurality of (for example, four) string units SU (SU0, SU1, SU2, . . . ).

The plurality of string units SU includes a plurality of NAND strings (memory strings) NS. The NAND string NS includes a plurality of memory cells MC which are connected in series. The number of blocks BLK in the memory cell array 10, the number of string units SU in one block BLK, and the number of memory cells MC in the NAND string NS may be any positive number.

The NAND string NS includes a plurality of memory cells (also referred to as memory units or memory elements) MC, and a plurality of select transistors STD, STS, STSB.

The memory cell MC includes a control gate and a charge storage layer (memory film). In the NAND string NS, the plurality of memory cells MC are connected in series between the select transistors STD and STS. Among the plurality of memory cells MC which are connected in series, one end (source/drain) of the drain-side memory transistor MC is connected to one end of the drain-side select transistor STD. Among the plurality of memory cells MC which are connected in series, one end of the source-side memory transistor MC is connected to one end of the source-side select transistor STS.

Each of a plurality of word lines WL (WL0, WL1, . . . , WLn-2, and WLn-1) is connected to the gate of the corresponding memory cell MC. The number "n-1" is a natural number of one or more. For example, the word line WL is connected in common to the memory cells MC in a plurality of string units SU. Data writing and data reading are collectively performed in one of the string units SU for the memory cell transistors MT connected to one of the word lines. This unit of data writing and data reading is referred to as "page".

A plurality of drain-side select gate lines SGD (SGD0 to SGD3) are respectively connected to the gates of the drain-side select transistors STD of the corresponding string units SU.

A plurality of source-side select gate line SGS (SGS0 to SGS3) are respectively connected to the gates of the source-side select transistors STS of the corresponding string units SU.

Further, one select gate line SGSB is provided in common to the plurality of string units SU.

The common select gate (hereinafter, referred to as a common source-side select gate line) SGSB is connected to the gates of the select transistors STSB in the plurality of string units SU. In the NAND string NS, one end of the select transistor (hereinafter, also referred to as a common source-side select transistor) STSB is connected to the other end of the source-side select transistor STS, and the other end of the select transistor STSB is connected to a source line SL.

One common source-side select gate line SGSB is connected in common to the gates of the plurality of common source-side select transistors STSB in the block BLK.

One end of the drain-side select transistor STD is connected to one of bit lines BL (BL0, BL1, . . . , and BLm-1). The number "m-1" is a natural number of one or more.

Figure 5:
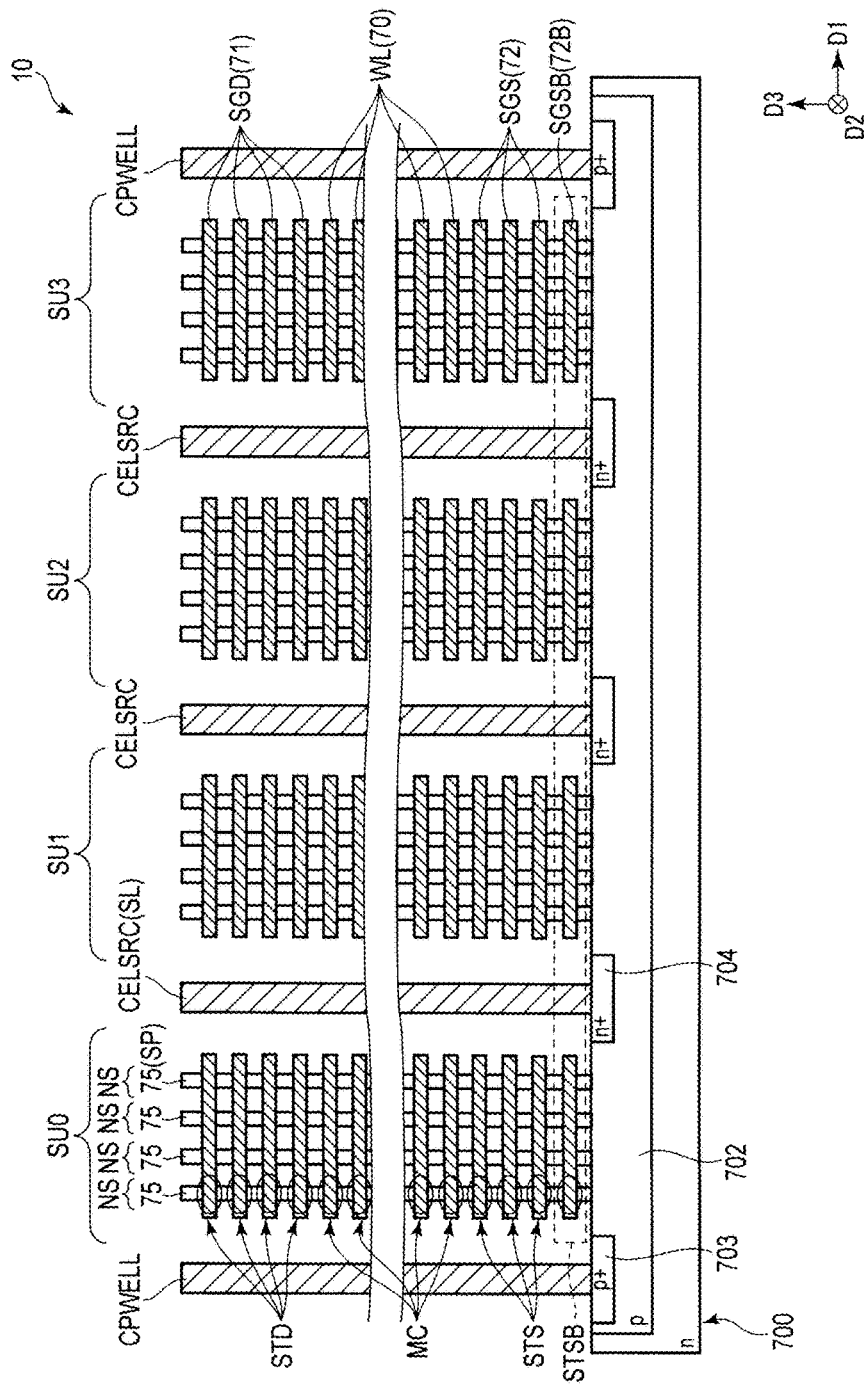
FIG. 5 is a schematic cross-sectional view illustrating a structure of the memory cell array of the memory device according to the embodiment.

As illustrated in a schematic cross-sectional structure diagram of the memory cell array of FIG. 5, the NAND strings NS in the memory cell array 10 are provided on a p-type well region 702 in the semiconductor substrate (for example, a Si substrate or a semiconductor region on an insulating layer) 700.

The p-type well region 702 is connected to the source line/well control circuit 50 through well contact CPWELL. The p-type well region 702 defines a block BLK. For example, the NAND strings NS in the block BLK are provided in a region surrounded by the well contact CPWELL. The well contact CPWELL is provided on a $p^+$ type diffusion layer 703 in the p-type well region 702.

Source line contacts CELSRC are provided on an $n^+$ type diffusion layer 704 in the p-type well region 702, between the string units SU. The source line contacts CELSRC are connected to the source line SL.

The NAND string NS includes a semiconductor pillar 75. The semiconductor pillar 75 is connected to the p-type well region 702. The semiconductor pillar 75 extends in a substantially vertical direction (D3 direction) relative to the surface of the p-type well region 702 (substrate). The semiconductor pillars 75 are arranged in an array shape on the substrate 700, in a D1 direction and a D2 direction.

A bit line (not illustrated) is provided above the upper end of the semiconductor pillar 75.

A plurality of conductive layers 70, 71, and 72 are stacked on the p-type well region 702. The respective conductive layers 70, 71, and 72 face the side surface of the semiconductor pillar 75 through a memory film (not illustrated).

The drain-side select transistor STD is arranged in a region including the semiconductor pillar 75 and the conductive layer 71. The plurality of (in the embodiment, four) stacked conductive layers 71 are gate electrodes of the select transistors STD. The stacked conductive layers 71 function as the drain-side select gate line SGD.

The source-side select transistor STS is arranged in a region including the semiconductor pillar 75 and the conductive layer 72. The plurality of (in the embodiment, three) stacked conductive layers 72 are gate electrodes of the source-side select transistors STS. The stacked conductive layers 72 function as the source-side select gate line SGS.

The common source-side select transistor STSB is arranged in a region including the semiconductor pillar 75 and the conductive layer 72B. The conductive layer 72B is the lowermost layer and is provided on the semiconductor substrate 700 through an insulating film (not illustrated). The conductive layer 72B is a common source-side select gate line SGSB. The conductive layer 72B serves as the gate electrode of the common source-side select transistor STSB.

The memory cell MC is arranged in a region including the semiconductor pillar 75 and the conductive layer 70. The conductive layer 70 functions as a word line WL.

Figure 6:
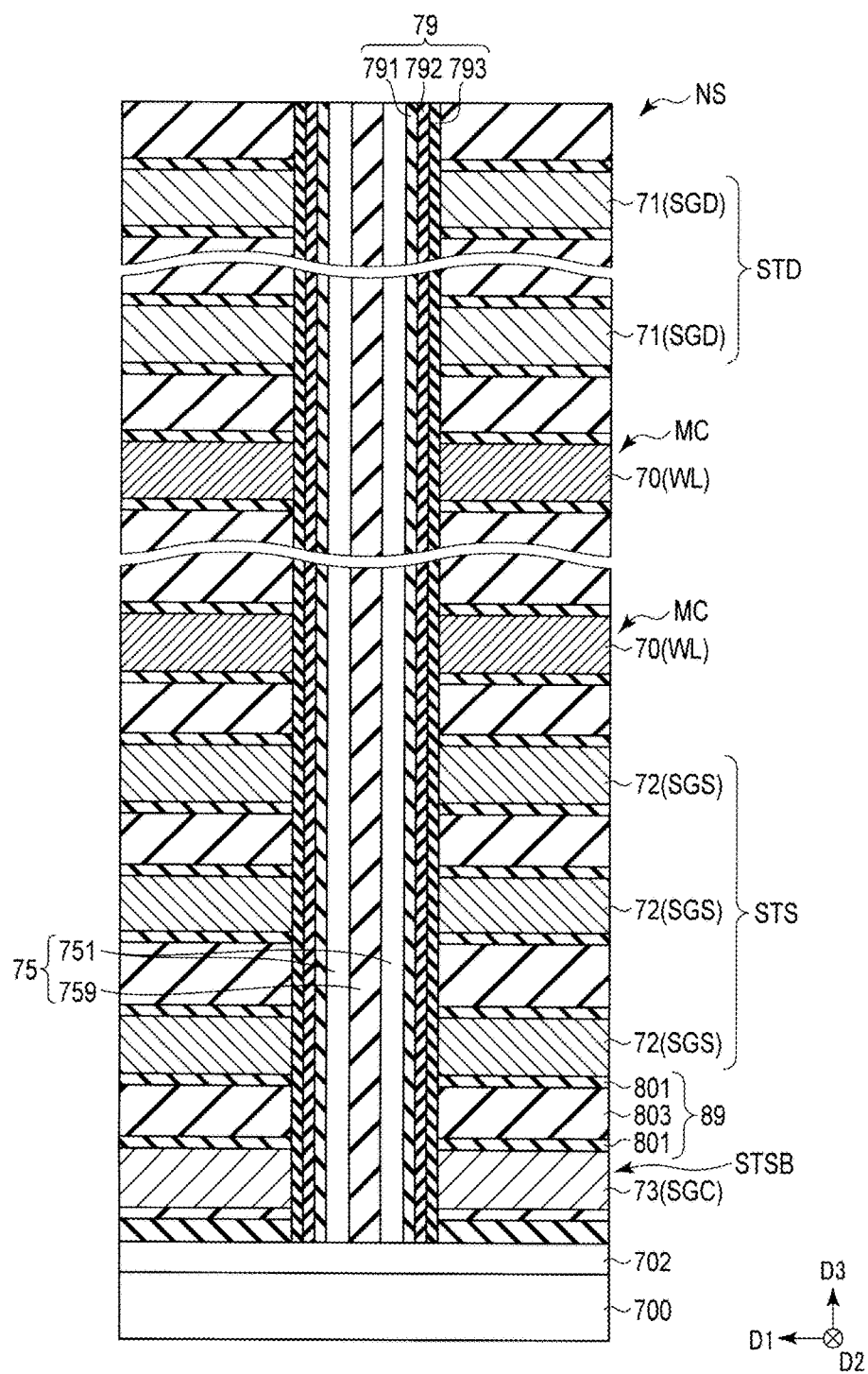
FIG. 6 is a cross-sectional view illustrating an example of a structure of memory cells of the memory device according to the embodiment.

As illustrated in FIG. 6, the memory cell MC includes a memory film 79 between the semiconductor pillar 75 and the conductive layer (word line) 71. The memory film 79 covers the side surface of the semiconductor pillar 75. The memory film 79 is continuous from the upper end to the lower end of the semiconductor pillar 75.

The memory film 79 has a stacked structure. The memory film 79 includes a gate insulating film 791, a charge storage layer 792, and a block insulating film 793.

The gate insulating film (tunnel insulating film) 791 is provided on the side surface of the semiconductor pillar 75. The charge storage layer 792 is provided between the gate insulating film 791 and the block insulating film 793. The block insulating film 793 is provided between the charge storage layer 792 and the conductive layers 70, 71, and 72. The charge storage layer 792 includes an insulating film including a trap site (for example, a SiN film). Further, the charge storage layer 792 may include a semiconductor film (for example, a silicon film). When the semiconductor film is provided in the charge storage layer 792, the semiconductor films for the respective memory cells are separated from each other.

An interlayer insulating film 89 is provided between the conductive layers 70, 71, and 72, in the D3 direction (the vertical direction relative to the semiconductor substrate surface). The interlayer insulating film 89 includes, for example, an insulating film 803 that is interposed between two insulating films 801.

For example, the semiconductor pillar 75 includes a core unit 759, and a semiconductor region 751. The core unit 759 includes a columnar insulator (for example, silicon oxide). The semiconductor region 751 covers the side surface of the core unit 759. The semiconductor region 751 is a channel region of the memory cell MC.

The semiconductor region 751 includes amorphous silicon or polysilicon.

Incidentally, the diameter of the lower end (the source side of the NAND string) of the semiconductor pillar may be smaller than the diameter of the upper end (the drain side of the NAND string) of the semiconductor pillar due to the manufacturing process of the memory cell array.

The structure, the operation, and the manufacturing method of the memory cell array of the three-dimensional structure may be as described in U.S. patent application Ser. No. 12/407,403 filed on Mar. 19, 2009, entitled "Three dimensional stacked nonvolatile semiconductor memory," U.S. patent application Ser. No. 12/406,524 filed on Mar. 18, 2009, entitled "Three dimensional stacked nonvolatile semiconductor memory," U.S. patent application Ser. No. 12/679,991 filed on Mar. 25, 2010, entitled "Non-volatile semiconductor storage device and method of manufacturing the same," and U.S. patent application Ser. No. 12/532,030 filed on Mar. 23, 2009, entitled "Semiconductor memory and manufacturing method thereof." All of these patent applications are incorporated by reference herein in their entirety.

The flash memory of the embodiment charges the semiconductor pillar 75, and discharges carriers (electrons/holes) trapped in a defect site (trap site) in the semiconductor pillar 75 from the inside of the semiconductor pillar 75.

As a result, in the embodiment, the inside of the semiconductor pillar 75 is reset (purged), and a program operation is executed in a state in which the semiconductor pillar 75 is reset (electrically stable state).

In the embodiment, for example, as in the operation described below, the charge of the semiconductor pillar 75 and the discharge of the carrier are executed after the verify read of the verify operation.

Thus, it is possible to improve reliability of the write operation in the flash memory according to the embodiment.

b. Operation Example

Figure 7:
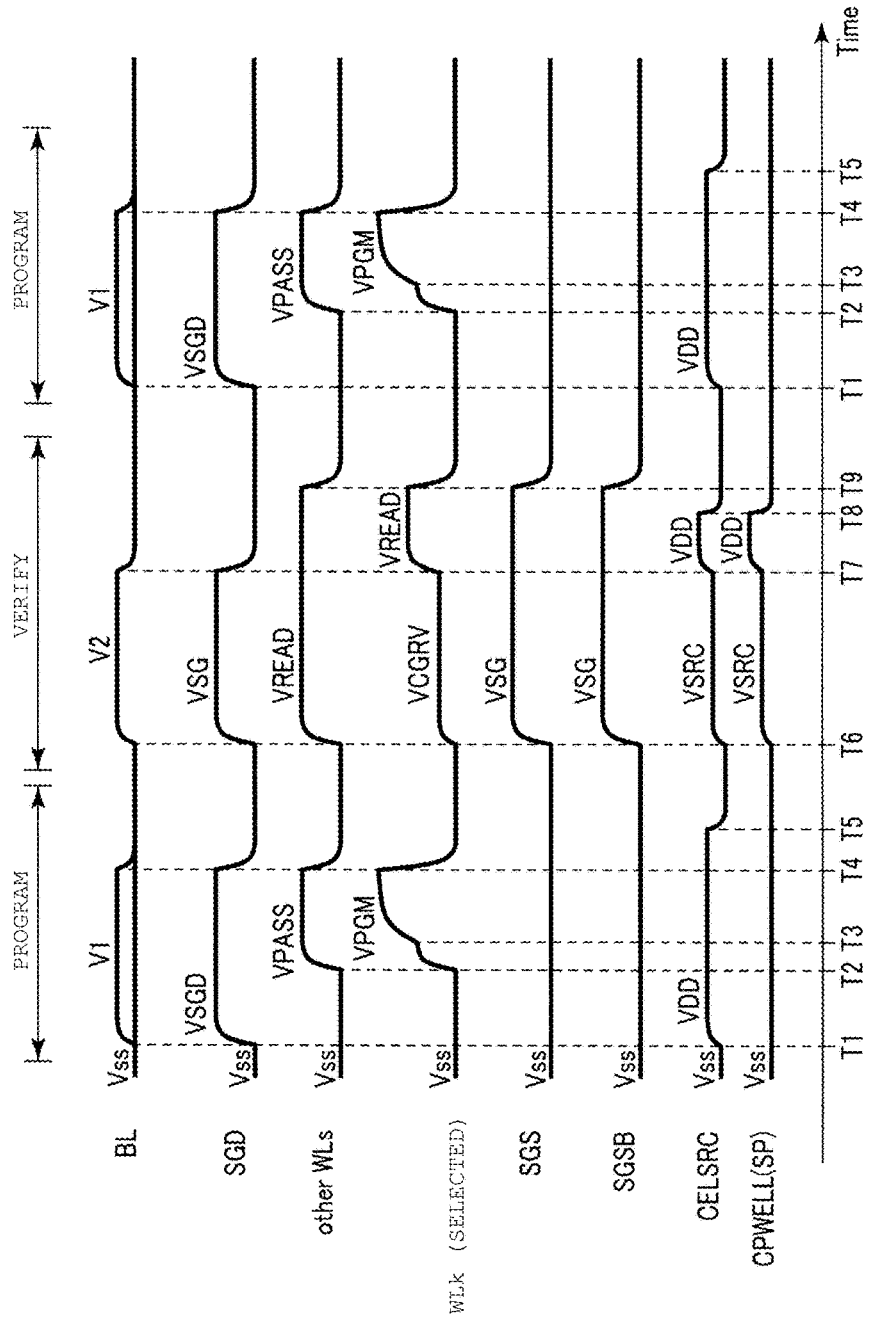
FIG. 7 is a timing chart illustrating an operation example of the memory device according to a first embodiment.

An operation example (control method) of the memory device of the first embodiment will be described with reference to FIG. 7. Here, the operation of the memory device of the embodiment will be described with reference to FIG. 1 to FIG. 6, in addition to FIG. 7.

In the following, the write operation of the flash memory will be described.

For example, the memory controller 5 transmits a write command, address (selection address) at which data is to be written, and the data to be written to the flash memory 1, in response to a request from the host device 600.

The flash memory 1 receives the write command, the selection address and the data.

The sequencer 19 starts the write operation including one or more write loops, based on the write command. The one write loop includes a program operation and a verify operation.

The sequencer 19 controls the respective circuits in the flash memory 1 so as to execute a program operation as follows. The threshold voltage of the memory cell MC is shifted toward a threshold value distribution corresponding to the data to be written.

Time T1

The voltage generation circuit 40 generates various voltages used for data writing, in response to the control of the sequencer 19.

The sense amplifier circuit 30 controls the potential of the bit line BL depending on the data to be written, in response to the control of the sequencer 19. Here, a write cell and a write protect cell are connected to the selected word line WLk. The write cell is a memory cell whose threshold voltage should be shifted. The write protect cell is a memory cell whose threshold voltage should not be shifted.

At time T1, the sense amplifier circuit 30 applies a voltage Vss to the bit line BL connected to the write cell. The sense amplifier circuit 30 applies a voltage V1 higher than 0 V to the bit line BL connected to the write protect cell.

The source line/well control circuit 50 applies a power supply voltage VDD to the source line CELSRC. The source line/well control circuit 50 applies a ground voltage Vss to the p-type well region CPWELL.

The row control circuit 20 applies the voltage Vss to the source-side select gate line SGS and the common source-side select gate line SGSB of the selected string unit SU in response to the control of the sequencer 19.

Further, the row control circuit 20 applies a voltage VSGD to the selected drain-side select gate line SGD in the selected string unit SU.

Thus, for the write cell, the bit line BL is electrically connected to the semiconductor pillar 75 through the drain-side select transistor STD which is in an ON state. On the other hand, for the write protect cell, the select transistor STD is cut off by the potential V1 of the bit line BL and the gate voltage VSGD of the drain-side select transistor STD.

Time T2 to T3

At time T2, the row control circuit 20 applies a non-selection voltage (write pass voltage) VPASS to a non-selected word lines otherWLs.

Further, the row control circuit 20 applies the write pass voltage VPASS to the selected word line WLk, simultaneously with the application of the voltage VPASS to the non-selected word lines otherWLs. k is an integer of 0 or more.

Thereafter, at time T3, the row control circuit 20 raises the potential of the selected word line WLk from the write path voltage VPASS to the program voltage VPGM.

Thus, electrons are injected to the memory film 79 of the write cell, with respect to the memory cell connected to the selected word line WLk. The threshold voltage of the memory cell is shifted from the state before the application of the program voltage VPGM, in a positive direction. Meanwhile, the channel region of the write protect cell in the semiconductor pillar 75 is boosted by itself, and electrons can be prevented from being injected to the memory film 79 of the write protect cell.

Time T4 to T5

After the application of the program voltage VPGM, the sequencer 19 controls the operation of the respective circuits, so as to terminate the program operation. Thus, at time T4, the potentials of the word line WLk, otherWLs and the select gate lines SGD, SGS, SGSB are set to the voltage Vss. In addition, at time T5, the potential of the source line CELSRC is set to the ground voltage Vss.

The sequencer 19 executes the verify operation after the program operation to determine whether or not the threshold voltage of the memory cell is within the distribution corresponding to the data to be written.

Time T6

At time T6, the sense amplifier circuit 30 applies a voltage V2 of a certain magnitude (V2>Vss) to the bit line BL in order to execute the verify operation.

The source line/well control circuit 50 applies a voltage VSRC to the source line CELSRC. The source line/well control circuit 50 applies the voltage VSRC to the well region CPWELL.

The row control circuit 20 applies a voltage VSG to the respective select gate lines SGD, SGS, SGSB so as to turn on the select transistors STD, STS, STSB.

The row control circuit 20 applies a non-selection voltage (read pass voltage) VREAD to the non-selected word lines otherWLs, and turns on the memory cells connected to the non-selected word lines otherWLs.

The row control circuit 20 applies a verify voltage (read voltage) VCGRV to the selected word line WLk.

When the selected cell MC is turned on by application of the verify voltage VCGRV, a current (cell current) flows between the bit line BL and the source line CELSRC. At this time, the potential of a node connected to the bit line BL changes.

The sense amplifier circuit 30 senses generation of a current (or a variation in the potential of the node). The sense amplifier circuit 30 latches the signal corresponding to the sense result in the latch.

If the selected cell MC is turned on, the threshold voltage of the turned-on selected cell MC is the verify voltage or less. This means that the threshold voltage of the selected cell MC does not reach the threshold voltage corresponding to the data to be written. In other words, this means that data writing is not completed for the selected cell which is turned on by application of the verify voltage VCGRV.

As a result, it is determined that verify is failed for the selected cell MC for which a current occurs in the bit line BL.

During the application of the verify voltage VCGRV, when the selected cell is turned off, a current does not flow between the bit line BL and the source line SL which are connected to the selected cell being in the OFF state. At this time, the potential of the node connected to the bit line BL does not change.

The sense amplifier circuit 30 senses non-occurrence of current (maintenance of the potential of the node). The sense amplifier circuit 30 latches the signal corresponding to the sense result in the latch.

If the selected cell MC is turned off, the threshold voltage of the turned-off selected cell MC is greater than the verify voltage. This means that the threshold voltage of the selected cell MC reaches the threshold voltage corresponding to data to be written. In other words, this means that data writing is completed for the selected cell which is turned off by application of the verify voltage VCGRV.

As a result, it is determined that verify is passed for the selected cell MC for which a current does not flow in the bit line.

In this way, in the period from time T6 to time T7, sensing of the current (or the potential) of the bit line in the verify operation (hereinafter, also referred to as verify read) is performed.

In the following manner, in the embodiment, after the verify read is completed, the sequencer 19 discharges the carriers trapped in the semiconductor pillar 75. In the following description, an operation of discharging the carriers trapped in the semiconductor pillar 75 and purging the semiconductor pillar is also referred to as a reset operation.

Time T7

At time T7, the sequencer 19 sets the potential of the bit line BL and the drain-side select gate line SGD to the ground potential Vss in order to electrically separate the semiconductor pillar 75 from the bit line BL.

Substantially at the same time as this, the sequencer 19 raises the potential of the selected word line WLk from the read voltage VCGRV to the read pass voltage VREAD. As a result, channel is formed in the semiconductor pillar 75 of the selected cell MC.

The sequencer 19 maintains the potential of the non-selected word lines otherWLs to the read pass voltage VREAD, and maintains the potentials of the source-side select gate line SGS, SGSB to the voltage VSG.

As a result of this, the entire NAND string from the upper end to the lower end of the semiconductor pillar 75 is electrically connected to the source line CELSRC and the well region CPWELL.

The sequencer 19 sets the potential of the source line CELSRC and the potential of the well region CPWELL to the power supply voltage VDD, and charges the source line CELSRC and the well region CPWELL.

For example, the potential of the well region CPWELL (702) is applied to the semiconductor pillar 75, through the source-side select transistors STS, STSB and the memory cell MC which are in the ON state. Therefore, the semiconductor pillar SP (75) is pre-charged to about the potential VDD of the well region CPWELL (702). In addition, instead of the power supply voltage VDD, the voltage VSRC may be applied to the source line CELSRC and the well region CPWELL.

Time T8 to T9

At time T8, the sequencer 19 sets the potential of the source line CELSRC and the potential of the well region CPWELL from the power supply voltage VDD to the ground potential Vss, and discharges the potential of the source line CELSRC and the well region CPWELL.

Thereafter, at time T9, the sequencer 19 sets the potentials of all word lines WLk, otherWLs and source-side select gate lines SGS, SGSB in the selected block to the ground potential Vss.

As a result, during a period from time T7 in which the channel is formed in the pre-charged semiconductor pillar 75 to time T9, the channel formed inside the semiconductor pillar 75 is a moving path of the carriers (electrons), and the carriers that are trapped in the trap site inside the semiconductor pillar 75 are extracted from the semiconductor pillar 75 to the semiconductor substrate 700 (the well region 702).

In this way, the pre-charge verify operation for the semiconductor pillar 75 in the flash memory of the embodiment (discharge of carriers that are trapped in the semiconductor pillar) is terminated.

The sequencer 19 determines whether or not to execute the write loop again based on the verify result obtained by the verify operation.

If there is a selected cell MC for which verify is failed in the selection page, the sequencer 19 performs the write loop (operation from time T1 to T9) again.

According to the embodiment, it is possible to perform the program operation after the verify operation in a state where carriers trapped in the semiconductor pillar 75 are discharged. Therefore, in the flash memory of the embodiment, during the program operation, it is possible to suppress the electrons resulting from the gate induced drain leakage (GIDL) from being injected into the charge storage layer of the memory cell MC (erroneous write), near a region in which the self-boosting of the write protect cell is not sufficient.

If verify is passed for all of the selected cells in the selected page, the sequencer 19 determines that a write operation for the selection page is completed.

The flash memory 1 (sequencer 19) notifies the memory controller 5 of the completion of the write operation. The memory controller 5 detects the completion of the data writing of the flash memory 1, based on the notification from the flash memory 1 (for example, a ready/busy signal having an H level).

As described above, the data writing of the flash memory 1 is completed.

Further, in the flash memory of the embodiment, a well-known technique can be applied to the read operation and the erase operation. Therefore, a description regarding the read operation and the erase operation of the flash memory of the embodiment is omitted.

c. Summary

If the semiconductor pillar provided with the memory cell is amorphous silicon or polysilicon, silicon atom arrangement and crystal orientation are not uniform in the silicon region of the semiconductor pillar, and more trap sites are likely to be present as compared to single crystalline silicon.

Therefore, when the self-boosting in the channel region of the write protect cell is insufficient, due to carriers trapped in the semiconductor pillar, there is a possibility that erroneous writing to the write protect cell occurs.

In the flash memory of the embodiment, during a period between the verify read and the application of a program voltage, the semiconductor pillar is charged through, for example, a source line and a well region in a state in which the channel is formed in the semiconductor pillar.

Thus, in the flash memory of the embodiment, the carriers trapped in the semiconductor pillar extending in the vertical direction relative to the semiconductor substrate can be effectively discharged from the semiconductor pillar, and the electrical state of the interior of the semiconductor pillar can be a stable state (reset state).

As a result, the memory device of the embodiment can effectively perform boosting for the write protect cell.

Thus, it is possible to improve reliability of the write operation in the memory device according to the embodiment.

2. Second Embodiment

A memory device of a second embodiment will be described with reference to FIG. 8.

According to the embodiment, carriers trapped in the semiconductor pillar may be discharged from the drain side of the NAND string to the outside of the semiconductor pillar.

Figure 8:
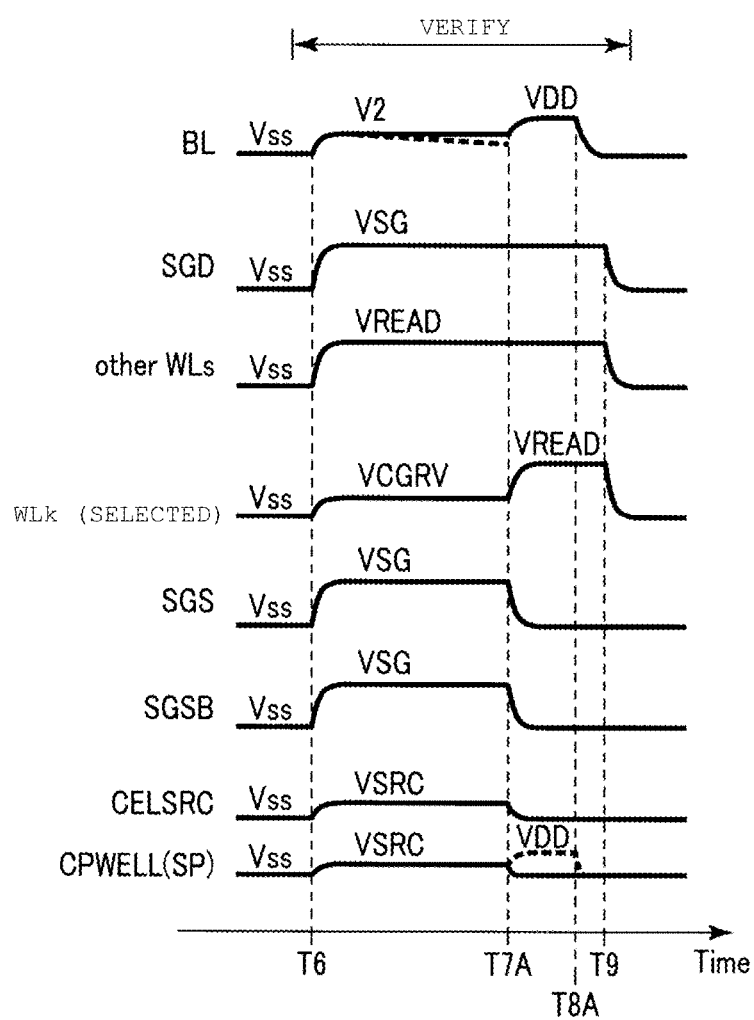
FIG. 8 is a timing chart illustrating an operation example of the memory device according to a second embodiment.

As illustrated in FIG. 8, at time T7A, after verify read (sensing of a bit line) is completed, the sequencer 19 sets the potentials of the source-side and common select gate lines SGS, SGSB, and the potentials of the source line CELSRC and the well region CPWELL to the ground voltage Vss.

Meanwhile, the potential of the drain-side select gate line SGD is maintained to the voltage VSG, and the semiconductor pillar SP (75) is electrically connected to the bit line BL.

The sequencer 19 raises the potential of the bit line BL to about the voltage VDD. Thus, the semiconductor pillar SP is pre-charged to the potential VDD of the bit line BL, through the drain-side select transistor STD which is in an ON state.

Thereafter, at time T8A, the sequencer 19 discharges the potential of the bit line BL, from the voltage VDD to the ground potential Vss.

As a result, during the period from time T7A to time T9 in which the channel is formed in the semiconductor pillar 75 of the NAND string, the carriers trapped in the trap sites in the semiconductor pillar 75 are extracted from the semiconductor pillar 75 to the bit line BL. The carriers extracted to the bit line BL are discharged to the ground terminal of the sense amplifier circuit 30.

In this way, according to the memory device of the embodiment, the same effect as the first embodiment is achieved, by the pre-charge of the semiconductor pillar from the bit line side and the discharge of the carriers.

3. Third Embodiment

A memory device of a third embodiment will be described with reference to FIG. 9.

Figure 9:
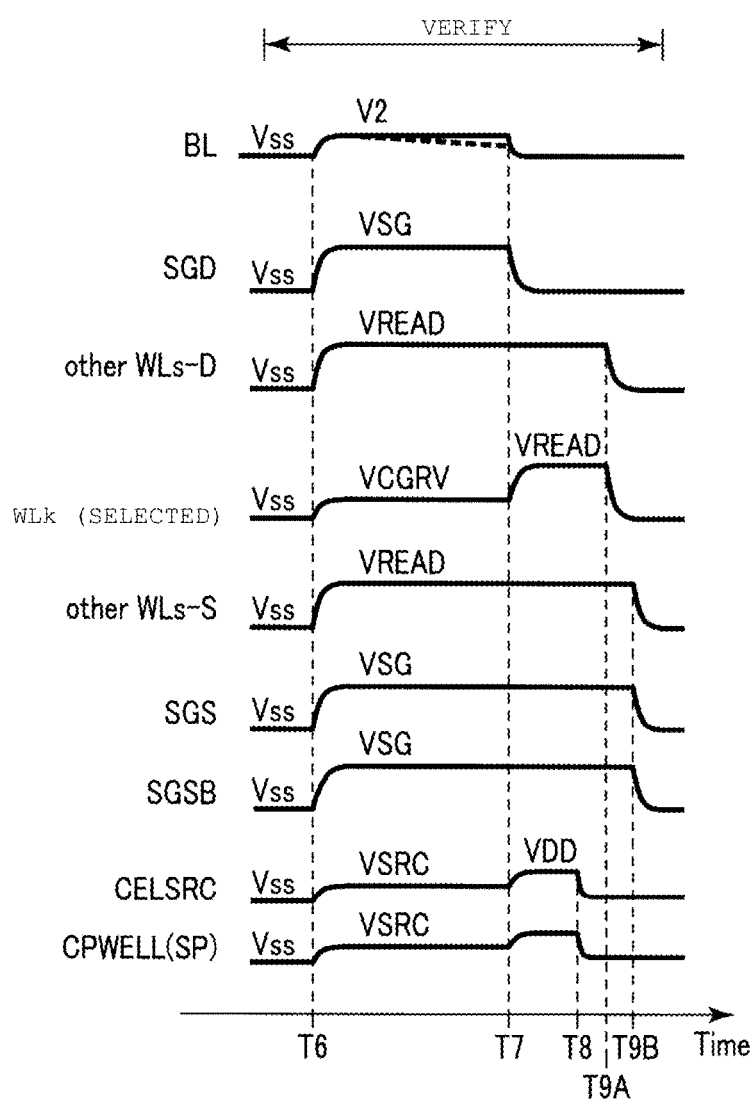
FIG. 9 is a timing chart illustrating an operation example of the memory device according to a third embodiment.

As illustrated in FIG. 9, in the memory device of the embodiment, timing for potential control of the word line during the pre-charge of the semiconductor pillar and the discharge of the carriers from the semiconductor pillar are different from the memory device of the first embodiment.

As illustrated in FIG. 9, at time T7, the source line CELSRC and the semiconductor pillar SP are charged to about a potential VDD.

At time T8, the source line CELSRC and the well region CPWELL are discharged to a ground potential Vss.

Thereafter, at time T9A, the sequencer 19 sets the potential of the selected word line WLk and the potential of the drain-side non-selected word lines otherWLs-D to the ground voltage Vss. Thus, the selected word line WLk and the drain-side non-selected word lines otherWLs-D are discharged. The drain-side non-selected word lines otherWLs-D are non-selected word lines which are present between the selected word line WLk and the drain-side select gate line SGD.

At time T9B, after the discharge of the selected word line WLk and the drain-side non-selected word lines otherWLs-D, the sequencer 19 sets the potentials of the source-side select gate lines SGS, SGSB and the potentials of the source-side non-selected word lines otherWLs-S to the ground voltage Vss. Thus, the source-side non-selected word lines otherWLs-S and the source-side select gate lines SGS, SGSB are discharged. The source-side non-selected word lines otherWLs-S are non-selected word lines which are present between the selected word line WLk and the source-side select gate line SGS.

In this way, it is possible to discharge the word line WL, while the semiconductor pillar 75 and the semiconductor substrate 700 are electrically connected by the channel in the semiconductor pillar 75, by dividing the NAND string NS into a plurality of logical regions so as to shift the discharge timing of the word line WL.

In the embodiment, since the potential of the word line is controlled, a period during which the semiconductor region on the lower end side of the semiconductor pillar is electrically connected to the well region/source line is longer than a period during the upper side of the semiconductor pillar is electrically connected to the well region/source line. Thus, the channel of the memory cell which is a moving path of carriers, from a region in the semiconductor pillar to the well region, is present in the semiconductor pillar for a long period of time.

Therefore, the memory device of the embodiment, the carriers trapped on the upper side of the semiconductor pillar can sufficiently be discharged to the well region (or the wiring).

In the embodiment, since a period of applying the voltage to the word line on the lower end side of the semiconductor pillar is long, it is possible to secure a time required for discharging a large amount of carriers on the lower end side of the semiconductor pillar having a small diameter.

As a result, according to the flash memory of the embodiment, it is possible to efficiently discharge the carriers trapped in the semiconductor pillar.

In addition, when performing the pre-charge of the semiconductor pillar from the bit line side and the discharge of the trapped carriers, after the selected word line WLk and the source-side select word line otherWLs-S are discharged, the drain-side non-selected word lines otherWLs-D and the drain-side select gate line SGD are discharged.

As described above, it is possible to improve reliability of the operation of the memory device according to the embodiment.

4. Fourth Embodiment

A memory device of a fourth embodiment will be described with reference to FIG. 10.

Figure 10:
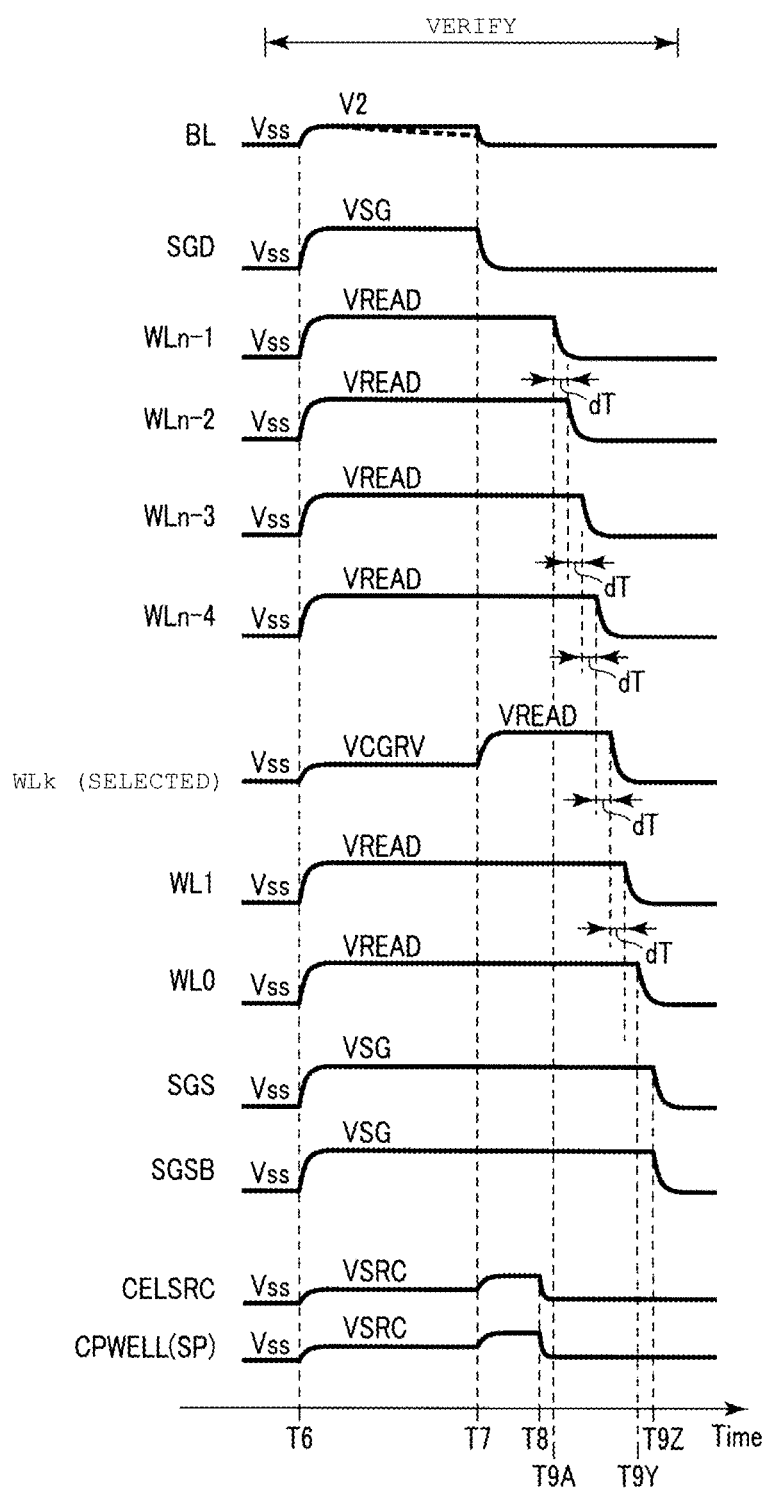
FIG. 10 is a timing chart illustrating an operation example of the memory device according to a fourth embodiment.

As illustrated in FIG. 10, a flash memory of the embodiment discharges the word line in order one by one from the word line on the drain-side (bit line side) to the word line on the source-side (source line side), during discharge of the carriers of the semiconductor pillar 75 after the verify read.

At time T9A, the sequencer 19 transitions the potential of the n-th word line WLn-1 which is adjacent to the drain-side select gate line SGD, from the read pass voltage VREAD to the ground voltage Vss. The potentials of the selected word line WLk and the other non-select word lines WL are maintained to the read pass voltage VREAD.

After the potential of the n-th word line WLn-1 is discharged, the sequencer 19 transitions the potential of the (n-1)-th word line WLn-2, from the read pass voltage VREAD to the ground voltage Vss, at a timing shifted only by time dT.

Similarly, the sequencer 19 sequentially transitions the potentials of respective word lines WL from the (n-2)-th word line WLn-3 to the word line WL0, from the read pass voltage VREAD to the ground voltage Vss, at a timing shifted only by time dT.

At time T9Y, the potential of the word line WL0 adjacent to the source-side select gate line SGS is set to the ground voltage Vss, and the word line WL0 is discharged.

Thereafter, at time T9Z, the sequencer 19 sets the potentials of the source-side select gate lines SGS, SGSB, to the ground voltage Vss.

In this way, during a period from time T9A to time T9Y, the potential of the word line WL is set to the ground voltage Vss, at a timing shifted by the time dT.

Accordingly, in the embodiment, similar to the third embodiment, the carriers trapped in the semiconductor pillar can be efficiently extracted.

In addition, in the embodiment, two adjacent word lines (or three or more word lines) WLn-1, WLn-2 are discharged at the same time, and two word lines WLn-1, WLn-2 may be discharged by shifting the time dT.

As described above, it is possible to improve reliability of the operation of the memory device according to the embodiment.

5. Fifth Embodiment

A memory device of a fifth embodiment will be described with reference to FIG. 11 and FIG. 12.

In the program operation, if the step-up writing is executed, the voltage value of a write voltage VPGM is increased, in accordance with an increase in the number of write loops that are included in the write operation.

Accordingly, since the risk of erroneous writing due to carriers trapped in the semiconductor pillar 75 is raised, it is preferable to increase the boosting efficiency of the semiconductor pillar at a write loop in the second half of the write operation.

In the case where the number of write loops is small, the risk of erroneous writing due to trapped carriers is relatively low. Therefore, after the verify read, the extraction of carriers from the semiconductor pillar 75 may be omitted in order to shorten the period of verify operation in the first half of the write operation.

For example, the flash memory of the embodiment selectively executes a verify operation without pre-charge of the semiconductor pillar (verify operation without a reset operation) and a verify operation with pre-charge of the semiconductor pillar (verify operation with a reset operation), in the write operation, based on a determination process using a certain determination value.

For example, in the flash memory of the embodiment, the sequencer 19 determines whether to perform a verify operation that includes pre-charge of the semiconductor pillar 75, by comparing a value obtained from the write operation and a determination value.

Figure 11:
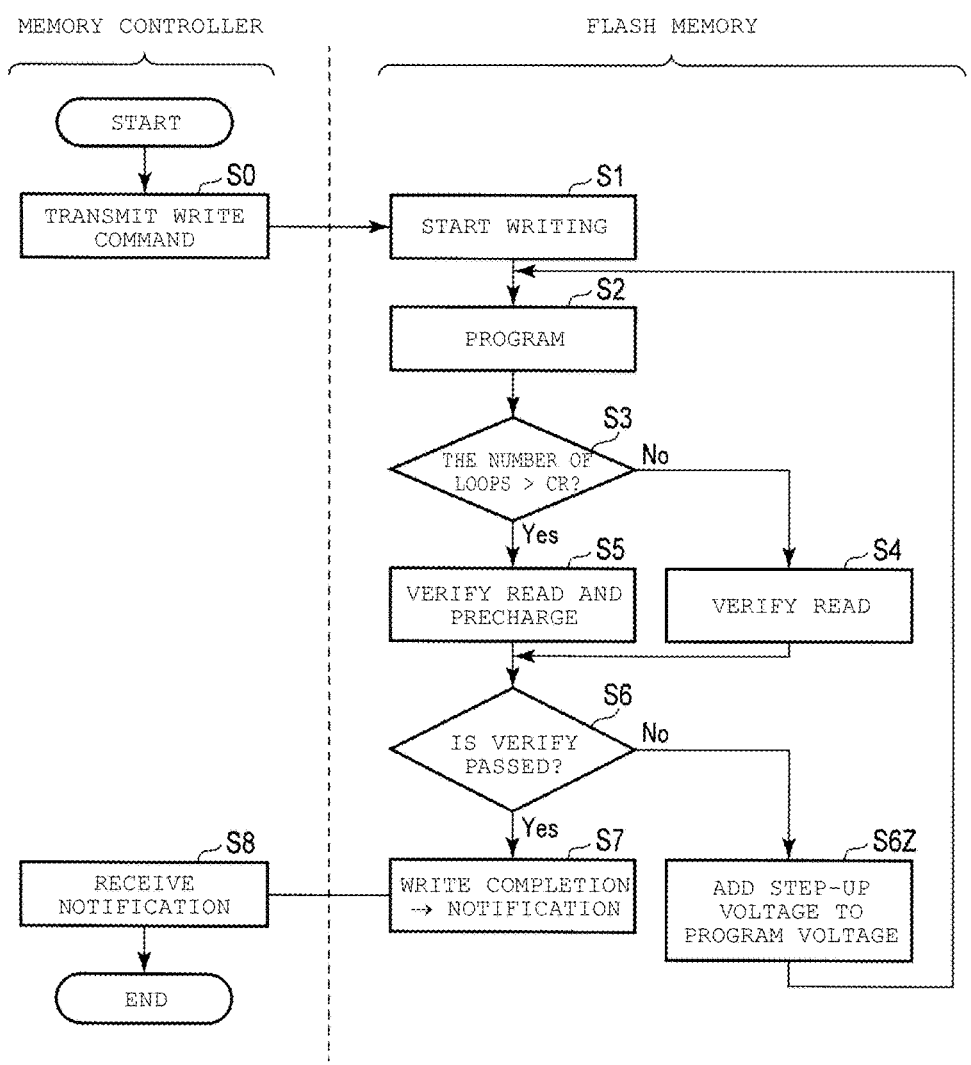
FIG. 11 is a flow chart illustrating an operation example of the memory device according to a fifth embodiment.
Figure 12:
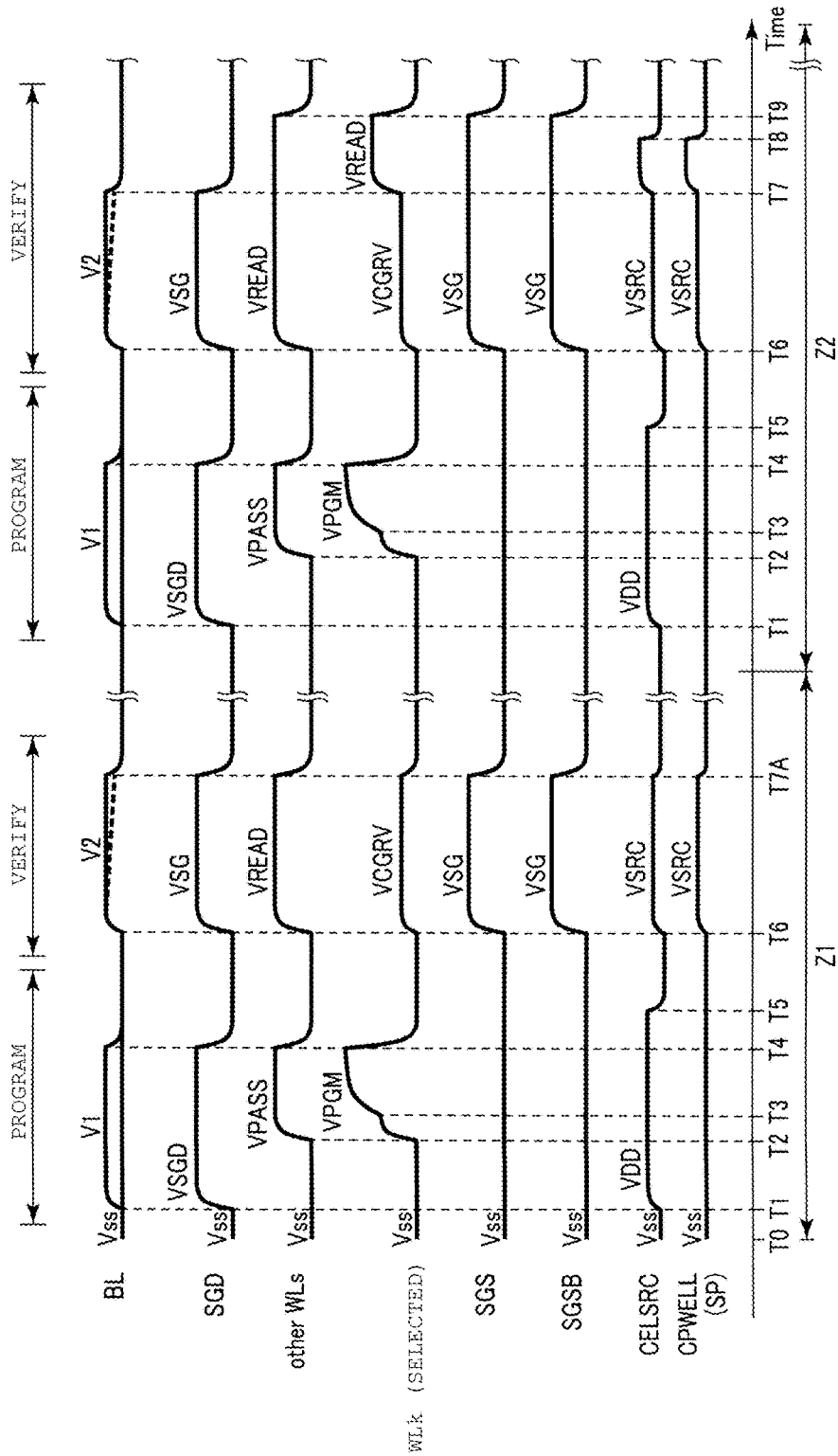
FIG. 12 is a timing chart illustrating the operation example of the memory device according to the fifth embodiment.

The memory controller 5 transmits a write command or the line to the flash memory 1, as illustrated in the flow chart in FIG. 11 and the timing chart in FIG. 12 (step S0).

The sequencer 19 starts the write operation based on a command, at time T0 (step S1).

The sequencer 19 executes the program operation, using the program voltage of a certain voltage value, similar to the embodiment described above (see FIG. 7), as illustrated in FIG. 12 (step S2).

The sequencer 19 determines whether or not the number NN of the current write loops exceeds the determination value CR, after the program operation or in parallel with the program operation (step S3).

When the number NN of write loops is the determination value CR or less, the sequencer 19 performs a verify operation without pre-charging (step S4).

As illustrated in FIG. 12, during the verify operation, when the pre-charge of the semiconductor pillar 75 is not performed (period Z1 during the write operation), at time T7A, the potential of each wiring is set to a ground voltage Vss, while the potential of the selected word line WLk and the potential of the source line CELSRC are not raised.

For example, since the number of write loops is small in the first half period Z1 of the write operation, the verify operation without pre-charging is executed, and the discharge processing of carriers from the semiconductor pillar is not performed.

The sequencer 19 determines whether or not verify is passed, based on the result of the verify operation (step S6).

When the verification result is determined to be a failure, the sequencer 19 adds the step-up voltage dV to the write voltage VPGM, in order to shift to the next write loop (step S6Z). This becomes the program voltage used in the next write loop. Using the program voltage VPGM obtained by adding the step-up voltage, the program operation and the verify operation without pre-charge of the semiconductor pillar, which are illustrated in steps S2, S3, S4, and S6, are executed again.

With the progress of the write operation without the verify pass, When the number NN of write loops (program operation) reaches the determination value CR (period Z2 in the write operation), the sequencer 19 executes the verify operation including pre-charging (step S5).

In this case, for example, based on the setting information of the flash memory 1, any one of the verify operations described in the first to fourth embodiments (FIGS. 6 to 10) is executed.

For example, since the number NN of write loops exceeds the determination value CR in the second half period Z2 of the write operation, the verify operation associated with pre-charge of the semiconductor pillar 75 is executed, in all of the write loops after the write loop that exceeds the determination value CR.

Whether or not the program operation is correct is determined based on the result of the verify operation including pre-charging (step S6).

If the determination of the verify result after step S5 is failed, the write loop is executed again.

When the verify result is passed, the sequencer 19 determines that the write operation is completed. The sequencer 19 notifies the memory controller 5 of the completion of the write operation, by the ready/busy signal (step S7).

The memory controller 5 receives the notification from the flash memory 1, and detects the completion of the write operation (S8).

In this way, the write operation in the flash memory of the embodiment is completed.

As described above, in the embodiment, when the number NN of write loops in the write operation exceeds the determination value CR, a verify operation with pre-charging in the embodiment described above is performed, and carriers trapped in the semiconductor pillar are extracted from the semiconductor pillar.

In this case, a verify operation without pre-charging is performed after a program operation, in each of one or more write loops before the number NN of write loops exceeds the determination value CR.

As a result, in the flash memory of the embodiment, a period for pre-charge of the semiconductor pillar in a certain write loop is reduced, and the entire period of the write operation is shortened.

As described above, in the write operation of the flash memory of the embodiment, a verify operation without pre-charging is performed in each write loop of a period Z1 from the start of the write operation to an i-th write loop of which the acquisition value is the determination value or less, and a verify operation with pre-charging is performed in each write loop of a period Z2 from an (i+1)-th write loop of which the acquisition value exceeds the determination value or less to the end of the write operation. The number i is an integer of one or more.

Instead of the number of the program operations performed during the write operation, whether or not to precharge the semiconductor pillar after the verify read may be determined depending on the magnitude of the voltage value of the write voltage VPGM.

In this case, the sequencer 19 determines whether or not the voltage value of the write voltage VPGM exceeds a preset determination value. When the sequencer 19 detects that the voltage value of the write voltage VPGM exceeds is greater than the determination value CR, the sequencer 19 performs the verify operation of any one of the first to fourth embodiments, for the verify operation that follows the programming operation using the voltage value.

As described above, it is possible to improve reliability of the flash memory, while suppressing the prolongation of the write operation.

6. Modification Example

Modification examples of the memory devices of the above-described embodiments will be described with reference to FIG. 13 and FIG. 14.

Figure 13:
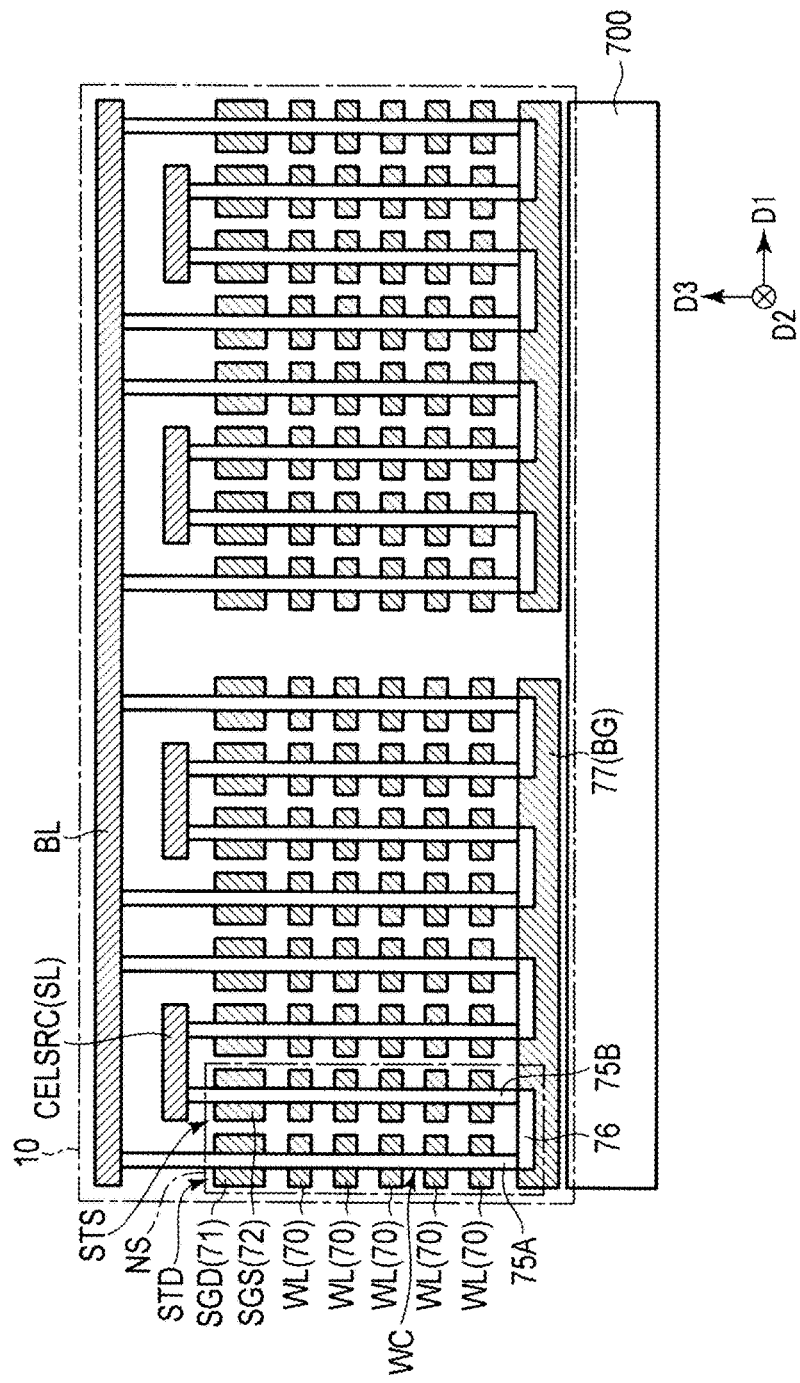
FIG. 13 is schematic a cross-sectional view illustrating a modification example of the memory device according to the embodiment.

As illustrated in FIG. 13, the memory device of the embodiment, a single NAND string NS may include two semiconductor pillars 75A, 75B.

For example, in the flash memory of FIG. 13, the NAND string NS includes first and second semiconductor pillars 75A, 75B, and a semiconductor unit 76 that connects two semiconductor pillars 75A, 75B.

The semiconductor unit 76 connects the lower end of the first semiconductor pillar 75A to the lower end of the second semiconductor pillar 75B.

The upper end of the first semiconductor pillar 75A is connected to bit line BL, and the upper end of the second semiconductor pillar 75B is connected to the source line SL.

A drain-side select transistor STD is provided on the upper side of the first semiconductor pillar 75A. A source-side select transistor STS is provided on the upper side of the second semiconductor pillar 75B. In the NAND string NS of FIG. 13, the source-side select transistor STS is located at the same height as the drain-side select transistor STD.

The memory cells MC are respectively provided on the side surfaces of first and second semiconductor pillars 75A, 75B, in a region between the select transistors STD, STS and the semiconductor unit 76.

For example, the semiconductor unit 76 faces the wiring layer 77 on the substrate 700, through a thin insulating film (not illustrated). Thus, a back gate transistor BGT is provided in a portion of the semiconductor unit 76. The wiring layer 77 functions as the back gate line BG and the gate electrodes of the back gate transistor BGT. The sequencer 19 turns on or off the back gate transistor BGT by controlling the potential of the back gate line BG.

Figure 14:
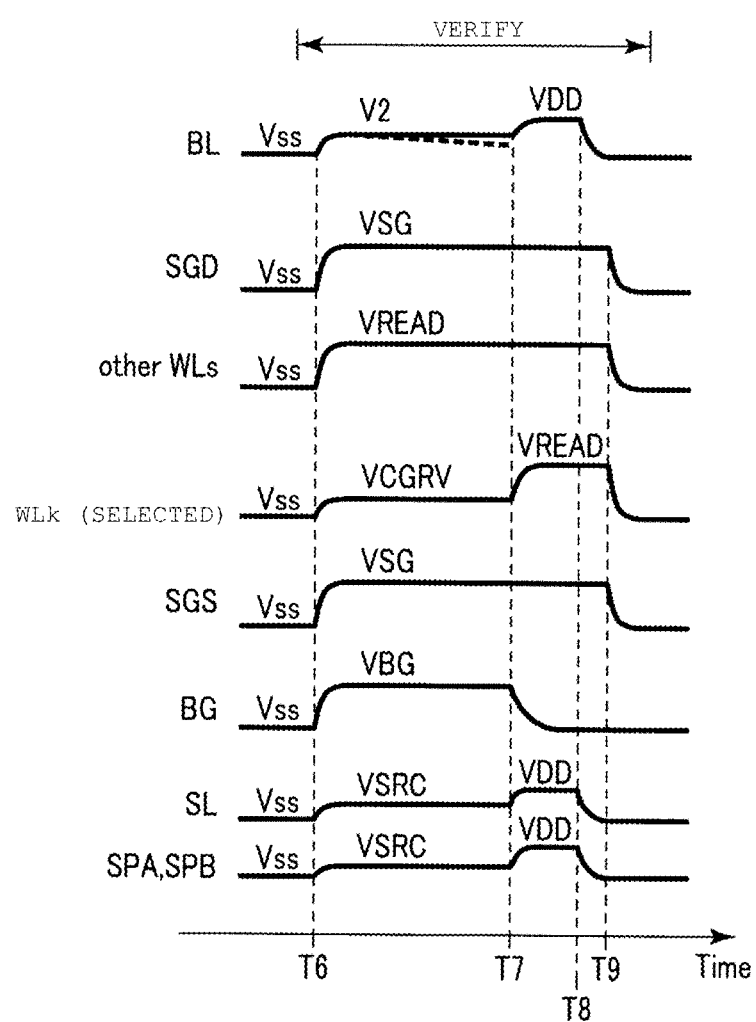
FIG. 14 is a timing chart illustrating an operation example of the modification example of the memory device according to the embodiment.

As illustrated in the timing chart of FIG. 14, the sequencer 19 applies the voltage VBG to the back gate line BG during the verify read (a period from time T6 to time T7). Thus, the back gate transistor BGT is turned on.

When discharging carriers trapped in the semiconductor pillars 75A, 75B, the sequencer 19 sets the potential of the back gate line BG to the ground voltage Vss at time T7. Thus, the back gate transistor BGT is turned off. The sequencer 19 maintains the potentials of the drain-side and source-side select gate lines SGD, SGS to the voltage VSG. At time T7, the sequencer 19 applies the voltage VDD to the bit line BL and the source line SL.

Accordingly, the semiconductor pillar 75A is electrically connected to the bit line BL, through the drain-side select transistor STD which is in the ON state. The semiconductor pillar 75A is pre-charged to approximately the potential VDD of the bit line BL. In a period from time T7 to time T9, carriers trapped in the semiconductor pillar 75A are discharged to the bit line BL.

Further, in the period from time T7 to time T9, the semiconductor pillar 75B is electrically connected to the source line SL, through the source-side select gate transistor STS which is in the ON state. The semiconductor pillar 75B is pre-charged to approximately the potential VDD of the source line SL. Carriers trapped in the semiconductor pillar 75B are discharged to the source line SL.

As described above, even if the NAND string NS has a structure in which a plurality of semiconductor pillars 75A, 75B are connected, carriers trapped in a plurality of semiconductor pillars 75A, 75B can be discharged to the outside of the semiconductor pillars 75A, 75B, by pre-charging from the upper end sides of the semiconductor pillars 75A, 75B.

As another variation example of the embodiment, the pre-charge of the semiconductor pillar 75 and the discharge of the carriers in the semiconductor pillar 75 may be performed, after sensing the bit line in the read operation.

In addition, in the flash memory including the memory cell array of a three-dimensional structure, the word line adjacent to the drain-side select gate line SGD and the word line adjacent to the source-side select gate line SGS are used as dummy word lines in some cases. The memory cells connected to the dummy word lines are cells (dummy cells) which are not used for storing data. Even if the NAND string includes the dummy word lines and the dummy cells, in the memory device of the embodiment, it is possible to apply substantially the same control as the control performed on the word line to the control of the potential of the dummy word line during verify operation, as the respective embodiments described above.

Thus, according to the memory device of this modification example, the same effect as in the embodiment described above can be achieved.

3. Others

The flash memory used in the memory system of the embodiment may be a multi-level flash memory.

For the read operation of the multi-level flash memory, the following determination voltages are used.

The determination voltage applied to the word line which is selected for an A-level read operation is in a range of, for example, 0 V to 0.55 V. The A-level determination voltage may be in any one range out of 0.1 V to 0.24 V, 0.21 V to 0.31 V, 0.31 V to 0.4 V, 0.4 V to 0.5 V, and 0.5 V to 0.55 V, without being limited to that value.

The determination voltage applied to the word line which is selected for a B-level read operation is in a range of, for example, 1.5 V to 2.3 V. The B-level determination voltage may be in any one range out of 1.65 V to 1.8 V, 1.8 V to 1.95 V, 1.95 V to 2.1 V, and 2.1 V to 2.3 V, without being limited to that value. The determination voltage applied to the word line which is selected for a C-level read operation is in a range of, for example, 3.0 V to 4.0 V. The C-level determination voltage may be in any one range out of 3.0 V to 3.2 V, 3.2 V to 3.4 V, 3.4 V to 3.5 V, 3.5 V to 3.6 V, and 3.6 V to 4.0 V, without being limited thereto.

In addition, the period (tR) of the read operation may be, for example, any one period out of 25 µs to 38 µs, 38 µs to 70 µs, and 70 µs to 80 µs.

The write operation of the multi-level flash memory includes a program operation and a verify operation.

In the write operation of the multi-level flash memory, the voltage which is first applied to the selected word line during the program operation is in a range of, for example, 13.7 V to 14.3 V. The voltage may be in any one range out of 13.7 V to 14.0 V and 14.0 V to 14.6 V, without being limited thereto.

When the program operation is executed by an incremental step pulse program (ISPP) method, a step-up voltage is, for example, about 0.5 V.

The non-selection voltage (pass voltage) to be applied to the non-selection word line may be a value in a range of, for example, 6.0 V to 7.3 V. However, the non-selection voltage may be, for example, a value in a range of 7.3 V to 8.4 V, or may be 6.0 V or less, without being limited to the value.

The pass voltage to be applied may be changed depending on whether the non-selection word line is an odd-numbered word line or an even-numbered word line.

The time (tProg) of the write operation may be, for example, any one period out of 1700 µs to 1800 µs, 1800 µs to 1900 µs, and 1900 µs to 2000 µs.

In the erase operation of the multi-level flash memory, the voltage, which is first applied to a well region which is formed on the upper part of the semiconductor substrate and above which the memory cell is arranged, is in a range of, for example, 12 V to 13.6 V. The voltage may be in any one range out of 13.6 V to 14.8 V, 14.8 V to 19.0 V, 19.0 V to 19.8 V, and 19.8 V to 21 V, without being limited to the value.

The time (tErase) of the erase operation may be, for example, any one period out of 3000 µs to 4000 µs, 4000 µs to 5000 µs, and 4000 µs to 9000 µs.

The memory cell includes a charge storage layer which is arranged on the side surface of the semiconductor pillar, through a tunnel insulating film of 4 nm to 10 nm. The charge storage layer may have a stacked structure of an insulating film (for example, SiN, SiON, or the like) having a film thickness of 2 nm to 3 nm and polysilicon having a film thickness of 3 nm to 8 nm. Further, the polysilicon may contain metal such as Ru.

The memory cell includes an insulating film on the charge storage layer. The insulating film includes a lower layer High-k film having a film thickness of 3 nm to 10 nm, an upper layer High-k film having a film thickness of 3 nm to 10 nm, and a silicon oxide film having a film thickness of 4 nm to 10 nm which is interposed between the lower layer and upper layer High-k films. An example of the High-k film is a film of HfO or the like. Further, the film thickness of the silicon oxide film may be thicker than the film thickness of the High-k film.

A control gate electrode having a film thickness of 30 nm to 70 nm is provided on the insulating film, through a material having a film thickness of 3 nm to 10 nm. This material is a metal oxide film such as TaO, and a metal nitride film such as TaN. The control electrode may be metal such as tungsten (W).

An air gap may be provided between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
   a word line above a semiconductor substrate;
   a semiconductor pillar extending through the word line in a direction crossing a surface of the semiconductor substrate;
   a memory cell at an intersection of the word line and the semiconductor pillar and having a gate electrically connected to the word line;
   a bit line electrically connected to a first end of the memory cell;
   a source line electrically connected to a second end of the memory cell; and
   a controller that controls a write operation on the memory cell, the write operation including a program operation followed by a verify operation,
   wherein during the verify operation on the memory cell, the semiconductor pillar is charged after performing a read operation on the memory cell.

2. The memory device according to claim 1,
   wherein the semiconductor pillar is electrically isolated from the bit line when the semiconductor pillar is charged through the source line.

3. The memory device according to claim 2,
   wherein, after the semiconductor pillar is charged through the source line, a first portion of the semiconductor pillar is electrically disconnected from the source line before a second portion of the semiconductor pillar is electrically disconnected from the source line.

4. The memory device according to claim 3, wherein the first portion of the semiconductor pillar is between the bit line and the memory cell and the second portion of the semiconductor pillar is between the memory cell and the source line.

5. The memory device according to claim 4, further comprising:
   upper word lines between the bit line and the memory cell and lower word lines between the memory cell and the source line, the semiconductor pillar passing through the upper word lines and the lower word lines,
   wherein each of the word lines are charged to a first voltage when the semiconductor pillar is charged and then the word lines are discharged in consecutive manner starting with an uppermost word line and ending with a lowermost word line.

6. The memory device according to claim 1,
wherein the semiconductor pillar is electrically isolated from the source line when the semiconductor pillar is charged through the bit line.

7. A memory device comprising:
a word line above a semiconductor substrate;
a semiconductor pillar extending through the word line in a direction crossing a surface of the semiconductor substrate;
a memory cell at an intersection of the word line and the semiconductor pillar and having a gate electrically connected to the word line;
a bit line electrically connected to a first end of the memory cell;
a source line electrically connected to a second end of the memory cell; and
a controller that controls a write operation on the memory cell, the write operation including one or more loops of a program operation followed by a verify operation,
wherein the semiconductor pillar is charged after performing a read operation on the memory cell during a verify operation, if a condition is satisfied during one of the loops subsequent to the first loop.

8. The memory device according to claim 7, wherein the condition is satisfied if a program voltage during the loop is greater than threshold voltage.

9. The memory device according to claim 7, wherein the condition is satisfied if loop number is greater than a threshold number.

10. The memory device according to claim 7,
wherein the semiconductor pillar is electrically isolated from the bit line when the semiconductor pillar is charged through the source line.

11. The memory device according to claim 10,
wherein, after the semiconductor pillar is charged through the source line, a first portion of the semiconductor pillar is electrically disconnected from the source line before a second portion of the semiconductor pillar is electrically disconnected from the source line.

12. The memory device according to claim 11, wherein the first portion of the semiconductor pillar is between the bit line and the memory cell and the second portion of the semiconductor pillar is between the memory cell and the source line.

13. The memory device according to claim 12, further comprising:
upper word lines between the bit line and the memory cell and lower word lines between the memory cell and the source line, the semiconductor pillar passing through the upper word lines and the lower word lines,
wherein each of the word lines are charged to a first voltage when the semiconductor pillar is charged and then the word lines are discharged in consecutive manner starting with an uppermost word line and ending with a lowermost word line.

14. The memory device according to claim 7,
wherein the semiconductor pillar is electrically isolated from the source line when the semiconductor pillar is charged through the bit line.

15. A memory device comprising:
a word line above a semiconductor substrate;
first and second semiconductor pillars extending in parallel through the word line in a direction crossing a surface of the semiconductor substrate;
a first memory cell at an intersection of the word line and the first semiconductor pillar, and having a gate electrically connected to the word line;
a second memory cell at an intersection of the word line and the second semiconductor pillar, and having a gate electrically connected to the word line;
a bit line electrically connected to a first end of the first memory cell;
a source line electrically connected to a first end of the second memory cell; and
a controller that controls a write operation on the memory cell, the write operation including a program operation followed by a verify operation,
wherein during the verify operation on the first and second memory cells, the first and second semiconductor pillars are charged after performing a read operation on the first and second memory cells.

16. The memory device according to claim 15,
wherein the first and second semiconductor pillars are electrically isolated from each other when the first and second semiconductor pillars are charged, and
wherein the first semiconductor pillar is charged through the bit line, and the second semiconductor pillar is charged through the source line.

17. The memory device according to claim 16, further comprising:
a back gate transistor in a current path between the first and second semiconductor pillars, the back gate transistor having a gate electrically connected to a back gate line that is charged to electrically connect the first and second semiconductor pillars and discharged to electrically disconnect the first and second semiconductor pillars.

18. The memory device according to claim 17, wherein the back gate line is charged during the read operation and then discharged after the read operation while the first and second semiconductor pillars are being charged.

19. The memory device according to claim 15, further comprising:
a first select gate transistor between the first memory cell and the bit line; and
a second select gate transistor between the second memory cell and the source line,
wherein the first and second select gate transistors are turned on while the first and second semiconductor pillars are charged.

20. The memory device according to claim 15, wherein the write operation includes a plurality of loops including a first loop and subsequent loops, and the first and second semiconductor pillars are charged during one of the subsequent loops.

* * * * *